(12) United States Patent
Saito et al.

(10) Patent No.: US 9,871,098 B2
(45) Date of Patent: Jan. 16, 2018

(54) SEMICONDUCTOR DEVICE WITH SUPPRESSED DECREASE IN BREAKDOWN VOLTAGE OF AN INSULATION FILM AND MANUFACTURING METHOD OF THE SAME

(71) Applicant: TOYOTA JIDOSHA KABUSHIKI KAISHA, Toyota-shi, Aichi-ken (JP)

(72) Inventors: Jun Saito, Toyota (JP); Atsushi Onogi, Toyota (JP); Sachiko Aoi, Nagakute (JP); Shoji Mizuno, Okazaki (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/516,837

(22) PCT Filed: Jul. 22, 2015

(86) PCT No.: PCT/JP2015/070891
§ 371 (c)(1),
(2) Date: Apr. 4, 2017

(87) PCT Pub. No.: WO2016/092896
PCT Pub. Date: Jun. 16, 2016

(65) Prior Publication Data
US 2017/0288014 A1     Oct. 5, 2017

(30) Foreign Application Priority Data
Dec. 11, 2014   (JP) .................. 2014-250511

(51) Int. Cl.
*H01L 29/78*   (2006.01)
*H01L 29/06*   (2006.01)
(Continued)

(52) U.S. Cl.
CPC .......... *H01L 29/063* (2013.01); *H01L 21/265* (2013.01); *H01L 29/0615* (2013.01);
(Continued)

(58) Field of Classification Search
CPC ............. H01L 29/0615; H01L 29/0619; H01L 29/0623; H01L 29/063; H01L 29/7811
See application file for complete search history.

(56) References Cited

U.S. PATENT DOCUMENTS

| | | | |
|---|---|---|---|
| 2009/0057756 A1* | 3/2009 | Hshieh | H01L 29/0661 257/330 |
| 2009/0085116 A1* | 4/2009 | Aoki | H01L 29/7811 257/355 |
| 2010/0078754 A1 | 4/2010 | Veliadis et al. | |

FOREIGN PATENT DOCUMENTS

| | | |
|---|---|---|
| JP | 2011-101036 A | 5/2011 |
| JP | 2012-504335 A | 2/2012 |
| JP | 2014-236094 A | 12/2014 |

\* cited by examiner

*Primary Examiner* — Zandra Smith
*Assistant Examiner* — Molly Reida
(74) *Attorney, Agent, or Firm* — Oliff PLC

(57) ABSTRACT

A semiconductor device may include a semiconductor substrate in which a semiconductor element is provided, and an insulation film provided on the semiconductor substrate, in which the semiconductor substrate may include a first portion and a second portion which has a thickness thinner than a thickness of the first portion, an upper surface of the second portion may be positioned lower than an upper surface of the first portion, a recess extending in a thickness direction of the semiconductor substrate may be provided on the upper surface of the second portion located at a position where the first portion and the second portion adjoin to each other, and the insulation film may extend over from the first portion to the second portion, and fill the recess.

6 Claims, 17 Drawing Sheets

(51) Int. Cl.
*H01L 21/761* (2006.01)
*H01L 21/762* (2006.01)
*H01L 21/265* (2006.01)

(52) U.S. Cl.
CPC ...... *H01L 29/0623* (2013.01); *H01L 29/0661* (2013.01); *H01L 29/7811* (2013.01)

SEMICONDUCTOR DEVICE WITH SUPPRESSED DECREASE IN BREAKDOWN VOLTAGE OF AN INSULATION FILM AND MANUFACTURING METHOD OF THE SAME

TECHNICAL FIELD

A technique disclosed in the present specification relates to a semiconductor device and a manufacturing method of the same.

BACKGROUND

A semiconductor device disclosed in Patent Literature 1 (Japanese Patent Application Publication No. 2011-101036) includes a semiconductor substrate and an insulation film provided on the semiconductor substrate. The semiconductor substrate includes a first portion and a second portion which has a thickness thinner than a thickness of the first portion, and the first portion and the second portion adjoin to each other. An upper surface of the second portion is positioned lower than an upper surface of the first portion. The insulation film extends over from the first portion to the second portion.

TECHNICAL PROBLEM

In the semiconductor device of Patent Literature 1, a void and crack sometimes occur in the insulation film due to thermal stress. For example, when a current flows in the semiconductor device, the semiconductor substrate generates heat, a temperature of the insulation film on the semiconductor substrate becomes high, and a void occurs due to the high temperature of the insulation film. Further, not only during an operation of the semiconductor device but also when the insulation film is formed on the semiconductor substrate, stress is generated within the insulation film and a crack occurs thereby. Especially in a part where the first portion and the second portion having different thicknesses adjoin to each other, compared to its surrounding part, the void and crack easily occur in the insulation film on the semiconductor substrate. Due to this, there is a problem that breakdown voltage of the insulation film decreases due to the void and crack. Therefore, the present specification offers a technique in which a decrease in breakdown voltage of an insulation film can be suppressed.

SOLUTION TO TECHNICAL PROBLEM

A semiconductor device disclosed in the present specification may comprise a semiconductor substrate in which a semiconductor element is provided and an insulation film provided on the semiconductor substrate. The semiconductor substrate may comprise a first portion and a second portion which has a thickness thinner than a thickness of the first portion. An upper surface of the second portion may be positioned lower than an upper portion of the first portion. A recess extending in a thickness direction of the semiconductor substrate may be provided on the upper surface of the second portion located at a position where the first portion and the second portion adjoin each other. The insulation film may extend over from the first portion to the second portion, and fill the recess. The second portion located at the position where the first portion and the second portion adjoin to each other refers to a range adjacent to the first portion within the second portion.

According to such a configuration, since the insulation film fills the recess at the position where the first portion and the second portion adjoin to each other, displacement and deformation of the insulation film is restrained by the recess. Due to this, even when a temperature of the insulation film becomes high, the insulation film does not expand, and thus a void and crack can be suppressed from occurring in the insulation film. For example, even when the semiconductor substrate generates heat due to a conduction of current and the temperature of the insulation film at the position where the first portion and the second portion adjoin to each other becomes high, the void can be suppressed from occurring in the insulation film at the position. Further, even when internal stress is applied to the insulation film during its manufacturing process, the crack can be suppressed from occurring in the insulation film at the position where the first portion and the second portion adjoin to each other. Therefore, according to this configuration, decrease in breakdown voltage of the insulation film can be suppressed.

In a manufacturing method disclosed in the present specification, a semiconductor device utilizing a semiconductor substrate that comprises a first portion and a second portion which has a thickness thinner than a thickness of the first portion, wherein an upper surface of the second portion is located lower than an upper surface of the first portion is manufactured. The manufacturing method may comprise forming a recess extending in a thickness direction of the semiconductor substrate on the upper surface of the second portion located at a position where the first portion and the second portion adjoin each other, and forming, on the semiconductor substrate, an insulation film extending over from the first portion to the second portion and filling the recess.

DESCRIPTION OF EMBODIMENTS

First Embodiment

Figure 1:
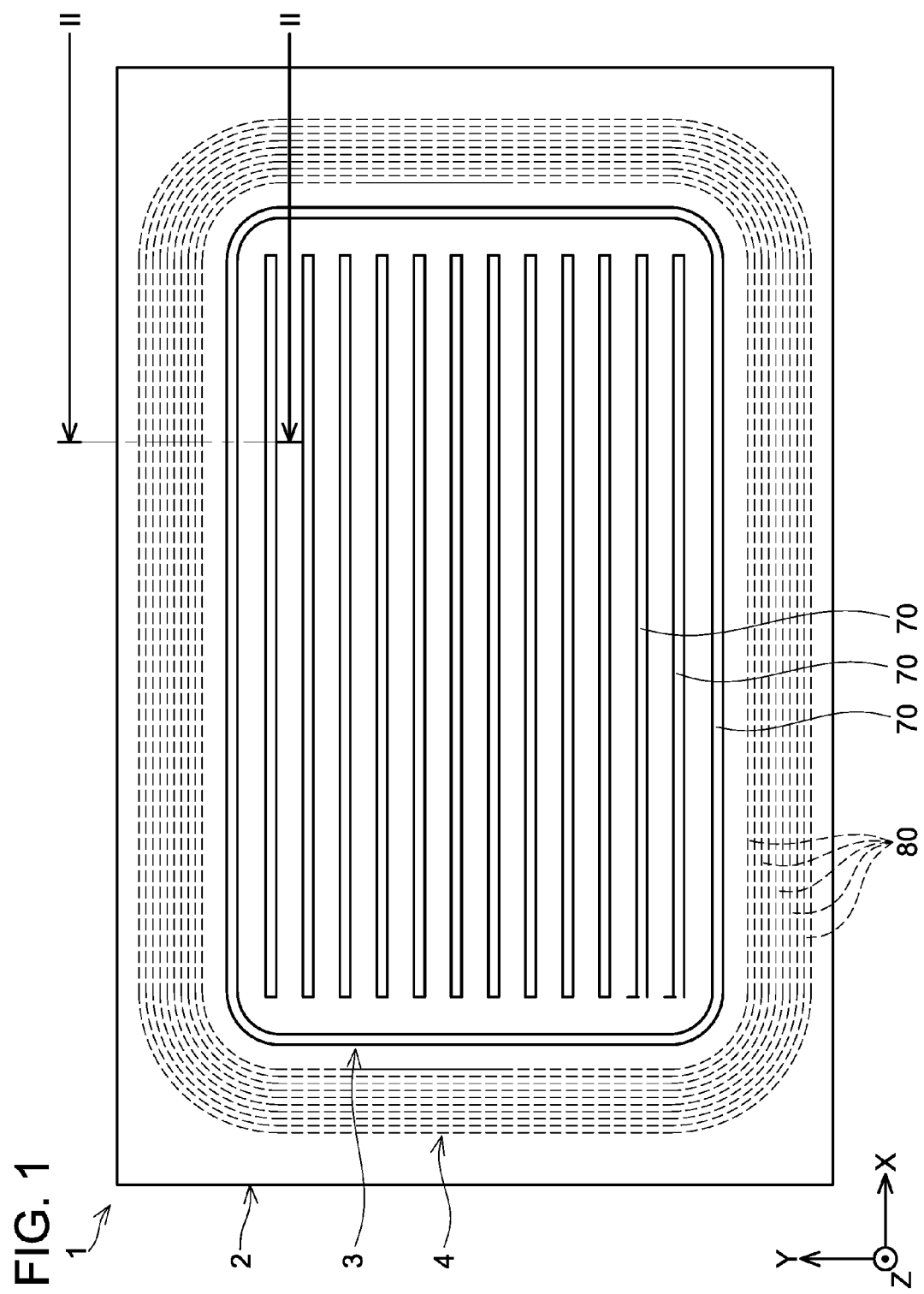
FIG. 1 is a top view of a semiconductor device.

With reference to the attached drawings, embodiments will be described below. As shown in FIG. 1, a semiconductor device 1 according to a first embodiment comprises a rectangular semiconductor substrate 2. The semiconductor substrate 2 is made of silicon carbide (SiC). In another embodiment, the semiconductor substrate 2 may be made of silicon (Si), gallium nitride (GaN), or the like. A semiconductor element is provided within the semiconductor substrate 2.

The semiconductor substrate 2 is provided with an element region 3 and a peripheral region 4. The element region 3 is provided with a semiconductor element. In the present embodiment, a vertical MOSFET (Metal Oxide Semiconductor Field Effect Transistor) is provided in the element region 3. The peripheral region 4 is provided on an outer side relative to the element region 3. The peripheral region 4 is provided with a high breakdown voltage structure. FIG. 1 shows only trenches 70 in the element region 3 and only field limiting rings 80 in the peripheral region 4 for easier view of the figure.

Figure 2:
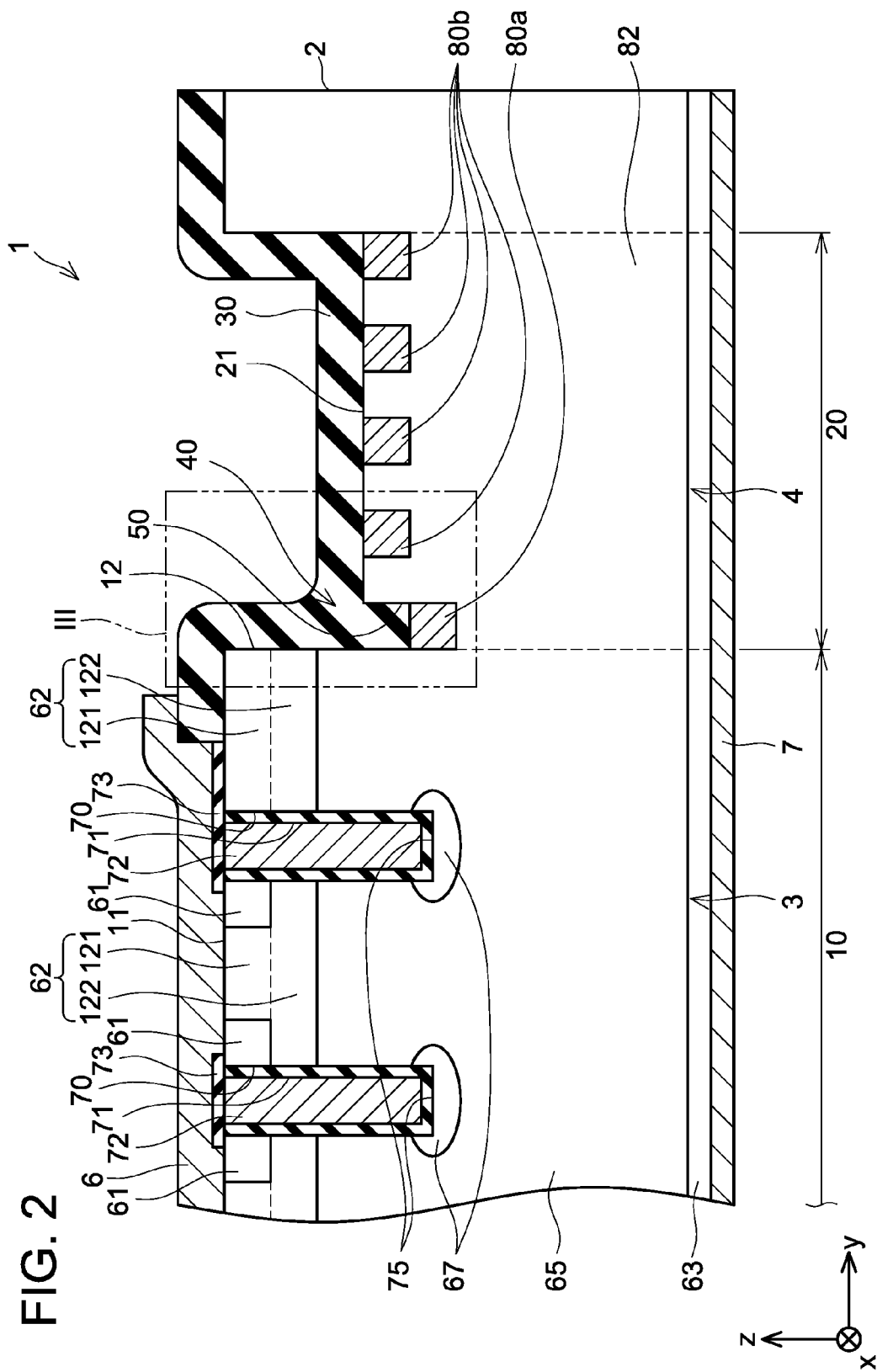
FIG. 2 is a cross sectional view along II-II of FIG. 1.

As shown in FIG. 2, the semiconductor device 1 comprises the semiconductor substrate 2, an insulation film 30, a front surface electrode 6, and a rear surface electrode 7.

The semiconductor substrate 2 comprises a first portion 10 and a second portion 20. The element region 3 is provided in the first portion 10. The peripheral region 4 is provided in the second portion 20. A thickness of the second portion 20 is thinner than a thickness of the first portion 10. The first portion 10 and the second portion 20 are provided so as to adjoin to each other. Due to the difference in the thicknesses of the first portion 10 and the second portion 20, a step is present between an upper surface 11 of the first portion 10 and an upper surface 21 of the second portion 20. The upper surface 21 of the second portion 20 is positioned lower than the upper surface 11 of the first portion 10.

The plurality of trenches 70 is provided in the first portion 10 of the semiconductor substrate 2. Further, source regions 61, a base region 62, a drift region 65, a drain region 63, and floating regions 67 are provided in the first region 10.

The trenches 70 are recesses provided in the upper surface 11 of the first portion 10. The trenches 70 extend in a thickness direction (z direction) of the semiconductor substrate 2. The trenches 70 extend to a depth reaching the drift region 65 from an upper surface of the semiconductor substrate 2 passing through the corresponding source regions 61 and the base region 62.

A gate insulation film 71 is provided on an inner surface of each trench 70. A gate electrode 72 is arranged in each trench 70. Each of the gate insulation films 71 is formed by an oxide film being deposited on the inner surface of corresponding one of the trenches 70. For example, a silicon dioxide film ($SiO_2$) can be used as the gate insulation film 71. Each of the gate electrodes 72 fills an inner side of corresponding one of the gate insulation films 71. The gate electrodes 72 are insulated from the semiconductor substrate 2 by the gate insulation films 71. The gate electrodes 72 are made of aluminum or polysilicon, for example. An interlayer insulation film 73 is arranged on each of the gate electrodes 72.

The source regions 61 are of an n-type. The source regions 61 have a high n-type impurity concentration. The source regions 61 are provided in a front layer part of the semiconductor substrate 2. The source regions 61 are provided in a range exposed on the upper surface of the semiconductor substrate 2 in islands. The source regions 61 are in contact with the front surface electrode 6. The source regions 61 are in ohmic contact with the front surface electrode 6 and electrically connected to the front surface electrode 6. Each of the source regions 61 is in contact with corresponding one of the gate insulation films 71.

The base region 62 is of a p-type. The base region 62 is provided in a surrounding of the source regions 61. The base region 62 is provided lateral to and below the source regions 61. The base region 62 is in contact with the gate insulation films 71. The base region 62 comprises a base contact region 121 and a low-concentration base region 122. The base contact region 121 has a high impurity concentration. An impurity concentration of the low-concentration base region 122 is lower than that of the base contact region 121.

The base contact region 121 is provided in the front layer part of the semiconductor substrate 2. The base contact region 121 is provided in a region exposed on the upper surface of the semiconductor substrate 2 in islands. The base contact region 121 is in contact with the front surface electrode 6. The base contact region 121 is in ohmic contact with the front surface electrode 6 and electrically connected to the front surface electrode 6.

The low-concentration base region 122 is provided below the source regions 61 and the base contact region 121. The low-concentration base region 122 has the p-type impurity concentration lower than that of the base contact region 121. The source regions 61 are separated from the drift region 65 by the low-concentration base region 122.

The drift region 65 is of the n-type. The drift region 65 has an n-type impurity concentration lower than that of the source regions 61. The drift region 65 is provided below the base region 62. The drift region 65 is in contact with the gate insulation films 71.

The drain region 63 is of the n-type. The drain region 63 has an n-type impurity concentration higher than that of the drift region 65. The drain region 63 is provided below the drift region 65. The drain region 63 is provided in a region exposed on a rear surface of the semiconductor substrate 2. The drain region 63 is in contact with the rear surface electrode 7. The drain region 63 is in ohmic contact with the rear surface electrode 7 and electrically connected to the rear surface electrode 7.

The floating regions 67 are of the p-type. Each of the floating regions 67 is provided in a surrounding of a bottom portion of corresponding one of the trenches 70. Each of the floating regions 67 is in contact with the bottom portions of the trench 70. The drift region 65 is provided in surroundings of the floating regions 67. The floating regions 67 are surrounded by the drift region 65. The floating regions 67 are separated from the base region 62 by the drift region 65. The floating regions 67 are separated from one another by the drift region 65.

A recess 50 is provided in the upper surface 21 of the second portion 20 of the semiconductor substrate 2. Further, the plurality of field limiting rings 80 and a peripheral drift region 82 are provided in the second portion 20 of the semiconductor substrate 2.

Figure 3:
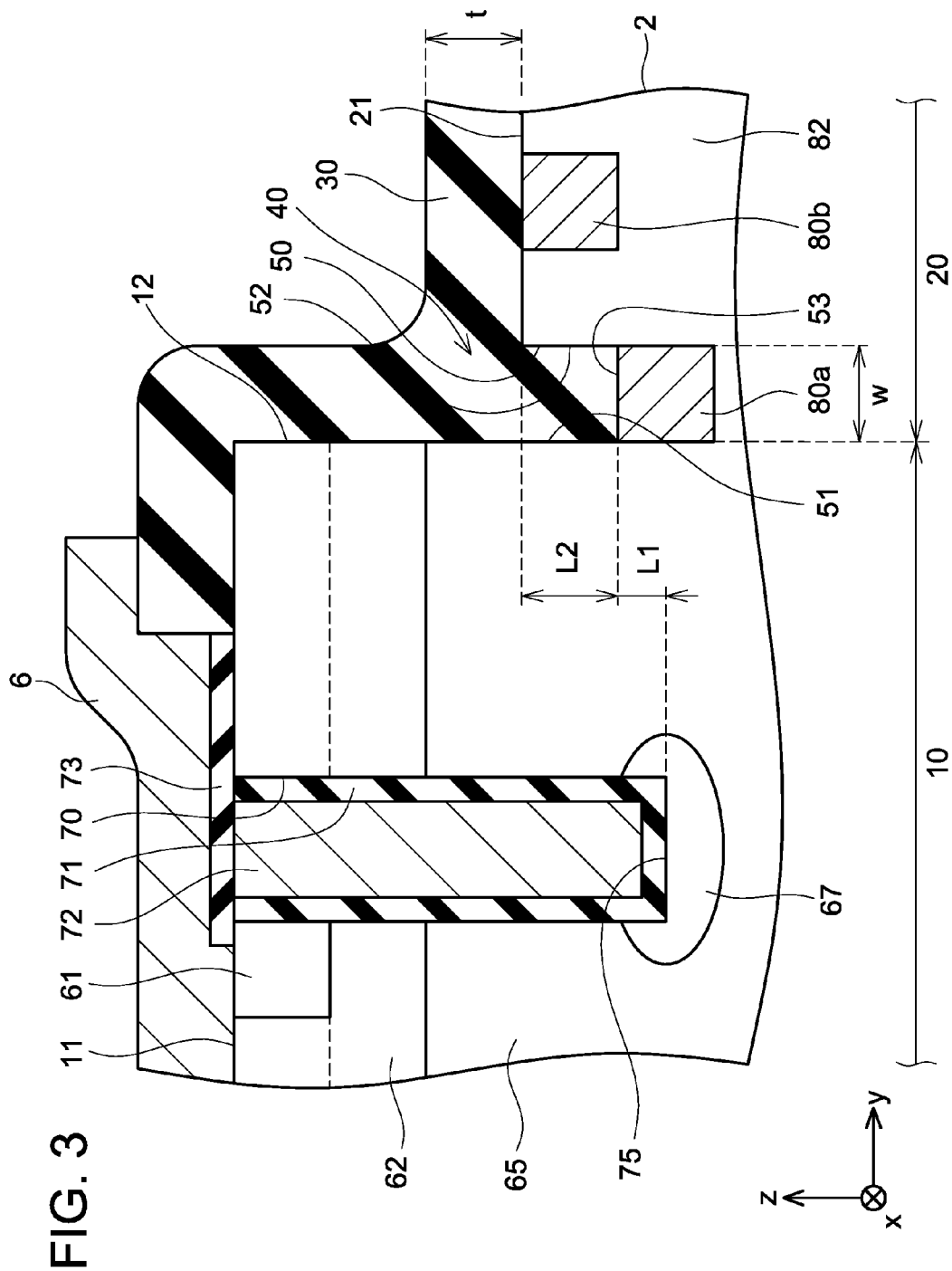
FIG. 3 is an enlarged view of a main section III of FIG. 2.

As shown in FIG. 3, the recess 50 is provided at a position where the first portion 10 and the second portion 20 adjoin to each other. The recess 50 is provided in the upper surface 21 of the second portion 20. The recess 50 extends in the thickness direction (the z direction) of the semiconductor substrate 2. The recess 50 extends along a side surface 12 of the first portion 10. The recess 50 is formed by etching the upper surface 21 of the second portion 20.

The recess 50 comprises a first side surface 51, a second side surface 52, and a bottom surface 53. The first side surface 51 and the second side surface 52 are opposed to each other. The first side surface 51 is a side surface on a first portion 10 side, and the second side surface 52 is a side surface on a second portion 20 side. The first side surface 51 and the second side surface 52 extend in the thickness direction (the z direction) of the semiconductor substrate 2. The first side surface 51 of the recess 50 extends downward from the side surface 12 of the first portion 10.

The bottom surface 53 of the recess 50 is provided between the first side surface 51 and the second side surface 52. The bottom surface 53 of the recess 50 is located above a bottom surface 75 of the trench 70. In the thickness direction (the z direction) of the semiconductor substrate 2, a distance L1 from the bottom surface 75 of the trench 70 to the bottom surface 53 of the recess 50 is shorter than a distance L2 from the bottom surface 53 of the recess 50 to the upper surface 21 of the second portion 20. That is, in the thickness direction (the z direction) of the semiconductor substrate 2, the bottom surface 53 of the recess 50 is located closer to the bottom surface 75 of the trench 70 than the upper surface 21 of the second portion 20.

Further, a width w of the recess 50 in a direction along which the first portion 10 and the second portion 20 adjoin to each other (a y direction) is equal to or less than twice a thickness t of the insulation film 30 provided on the upper surface 21 of the second portion 20. The width w of the recess 50 corresponds to a distance between the first side surface 51 and the second side surface 52.

As shown in FIG. 1, the field limiting rings 80 (hereinbelow, "field limiting ring" will be referred to as "FLR") are provided at intervals in a direction from the first portion 10 toward the second portion 20. The FLRs 80 are of the p-type. The FLRs 80 have a high impurity concentration.

As shown in FIG. 2, the FLR 80 which is the nearest to the first portion 10 among the plural FLRs 80 is indicated by a reference sign "80a", and the other FLRs 80 are indicated by a reference sign "80b". The FLR 80a which is the nearest to the first portion 10 is provided below the recess 50. The FLR 80a is provided in a range exposed on the bottom surface 53 of the recess 50. The FLR 80a is preferably provided at a same depth as the floating regions 67. Between the FLR 80a and the floating regions 67, the drift region 65 is provided. The FLR 80a is separated from the floating regions 67 by the drift region 65. The FLRs 80b are provided in a range exposed on the upper surface 21 of the second portion 20.

The peripheral drift region 82 is provided in surroundings of the FLRs 80. The peripheral drift region 82 is provided between the FLRs 80 and below the FLRs 80.

The front surface electrode 6 is provided on the upper surface 11 of the first portion 10 of the semiconductor substrate 2. The front surface electrode 6 is insulated from the gate electrodes 72 by the interlayer insulation films 73. The rear surface electrode 7 is provided on rear surfaces of the first portion 10 and the second portion 20 of the semiconductor substrate 2. The front surface electrode 6 and the rear surface electrode 7 are made of a metal such as aluminum (Al), copper (Cu), or the like.

The insulation film 30 is provided on the semiconductor substrate 2. A silicon dioxide film (SiO2) can be used as the insulation film 30. The insulation film 30 is made of a same material as the gate insulation films 71. The insulation film 30 can be formed by depositing an oxide film. The insulation film 30 covers the upper surface of the semiconductor substrate 2. The insulation film 30 extends over from the first portion 10 to the second portion 20 of the semiconductor substrate 2. The insulation film 30 covers a part of the upper surface 11 of the first portion 10, the side surface 12 of the first portion 10, and the upper surface 21 of the second portion 20. Further, the insulation film 30 covers upper surfaces of the FLRs 80. Further, the insulation film 30 covers the recess 50. An inside of the recess 50 is densely filled with the insulation film 30. The insulation film 30 is in close contact with the side surfaces 51 and 52, and the bottom surface 53 of the recess 50.

When the semiconductor device 1 comprising the above-mentioned configuration is used, a voltage which makes the rear surface electrode 7 positive is applied between the front surface electrode 6 and the rear surface electrode 7. Further, an on-voltage (voltage which is equal to or greater than a voltage required to form channels) is applied to the gate electrodes 72. When the on-voltage is applied to the gate electrodes 72, channels are formed in the low-concentration base region 122 in a range being in contact with the gate insulation films 71. Due to this, the MOSFET is turned on. At this occasion, electrons flow from the front surface electrode 6 to the rear surface electrode 7 through the source regions 61, the channels formed in the low-concentration base region 122, the drift region 65, and the drain region 63. Thereby, a current flows from the rear surface electrode 7 to the front surface electrode 6.

When the current flows in the semiconductor device 1, the semiconductor substrate 2 generates heat, and a temperature of the insulation film 30 provided on the semiconductor substrate 2 becomes high. Generally, in a portion where a step is provided such as the portion where the first portion 10 and the second portion 20 adjoin to each other, a part of an insulation film covering the step is more likely to be deformed due to thermal stress. Due to this, there is a problem that a void easily occurs in the insulation film covering the step. Contrary to this, according to the above-mentioned semiconductor device 1, the recess 50 is provided in the upper surface 21 of the second portion 20 at the position where the first portion 10 and the second portion 20 adjoin to each other, and the insulation film 30 fills the recess 50. Due to this, even when the temperature of the insulation film 30 becomes high, since the insulation film 30 fills up the recess 50, deformation of the insulation film 30 is suppressed by the insulation film 30 being restrained by the recess 50. Due to this, the void can be suppressed from occurring in the insulation film 30 in the portion where the first portion 10 and the second portion 20 adjoin to each other. Further, since the insulation film 30 does not expand in a lateral direction due to the recess 50, a crack can be suppressed from occurring in the insulation film 30. As above, the void and crack can be suppressed from occurring in the insulation film 30, and thus decrease in breakdown voltage of the insulation film 30 can be suppressed.

Further, in the above-mentioned semiconductor device 1, since the width w of the recess 50 is equal to or less than twice the thickness t of the insulation film 30 provided on the upper surface 21 of the second portion 20, the recess 50 can be densely filled with the insulation film 30. That is, when the insulation film 30 is formed, the insulation film 30 is deposited on the second portion 20. At this occasion, due to the width w of the recess 50 being equal to or less than twice the thickness t of the insulation film 30, the recess 50 with the width w is completely filled with the insulation film 30 before the insulation film 30 is deposited by the thickness t on the upper surface 21 of the second portion 20. Therefore, the recess 50 can be densely filled with the insulation film 30.

Further, in the above-mentioned semiconductor device 1, the p-type floating regions 67 are provided in surroundings of the bottom portions of the trenches 70. Due to this, when the semiconductor device 1 is off, a depletion layer expands into the drift region from a boundary between each p-type floating region 67 and the n-type drift region 65. A depletion layer expands into the drift region from a boundary between the p-type 80a and the n-type drift region 65 as well. When the distance L1 from the bottom surface 75 of the trench 70 to the bottom surface 53 of the recess 50 is shorter than the distance L2 from the bottom surface 53 of the recess 50 to the upper surface 21 of the portion 20, the depletion layer expanding from the floating region 67 and the depletion layer expanding from the p-type FLR 80a become continuous with each other. Due to this, electric field concentration in a vicinity of the bottom surface 53 of the recess 50 can be alleviated, and deterioration of the insulation film 30 covering the bottom surface 53 of the recess 50 can be suppressed.

Figure 4:
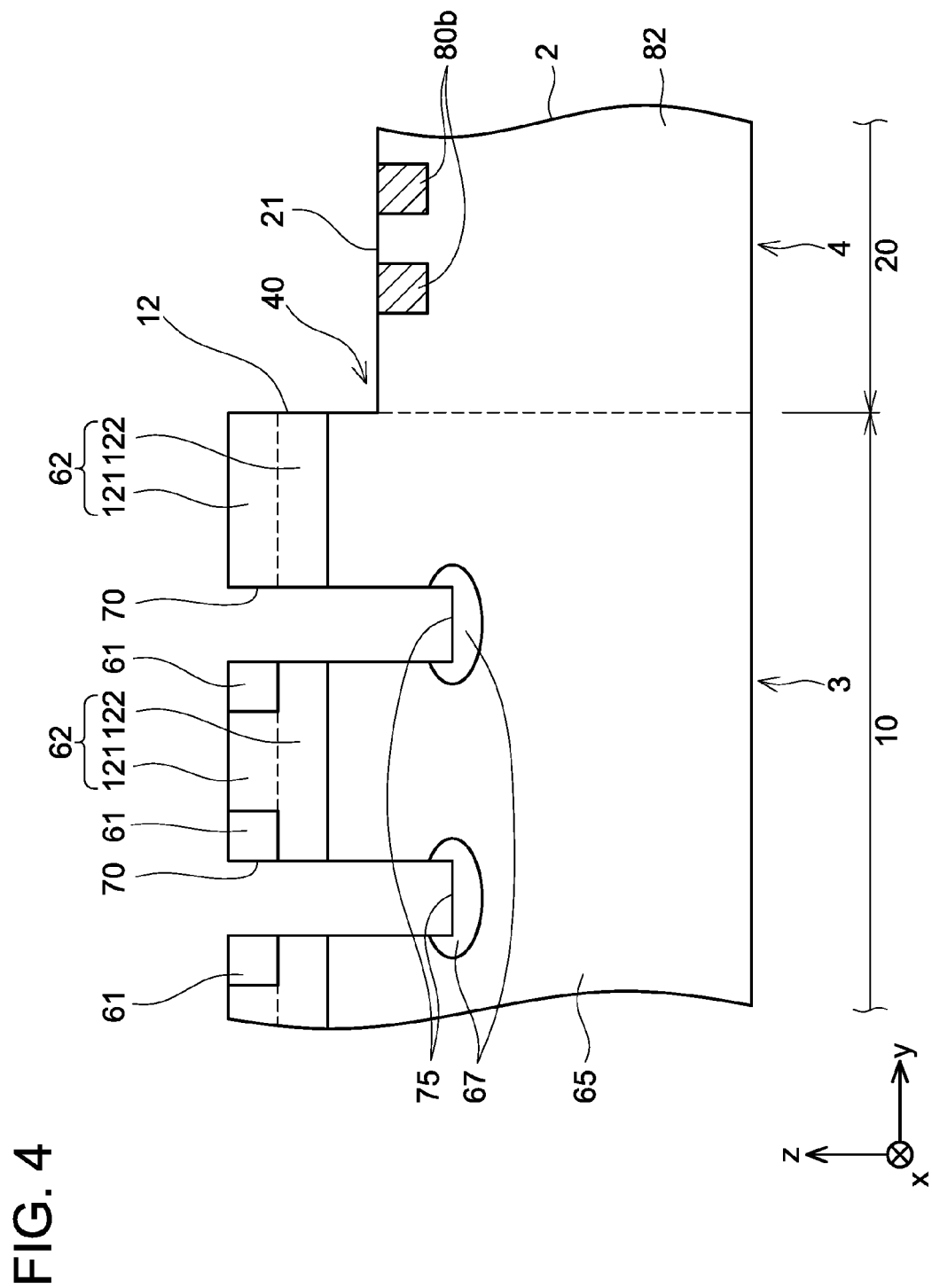
FIG. 4 is a view (1) for explaining a manufacturing method of the semiconductor device.

Next, a manufacturing method of the semiconductor device 1 comprising the above-mentioned configuration will be described. The semiconductor device 1 is manufactured from the n-type semiconductor substrate 2 including n-type impurities which are substantially the same as those in the drift region 65 and the peripheral drift region 82. Firstly, the semiconductor substrate 2 is processed as shown in FIG. 4. That is, the semiconductor substrate 2 is processed such that it includes the thick first portion 10 and the thin second portion 20. Further, the trenches 70, the source regions 61, the base region 62, the floating regions 67, and the FLRs 80b are formed in the semiconductor substrate 2. Since publicly known techniques can be used for these processes, detailed explanations thereof are omitted.

Figure 5:
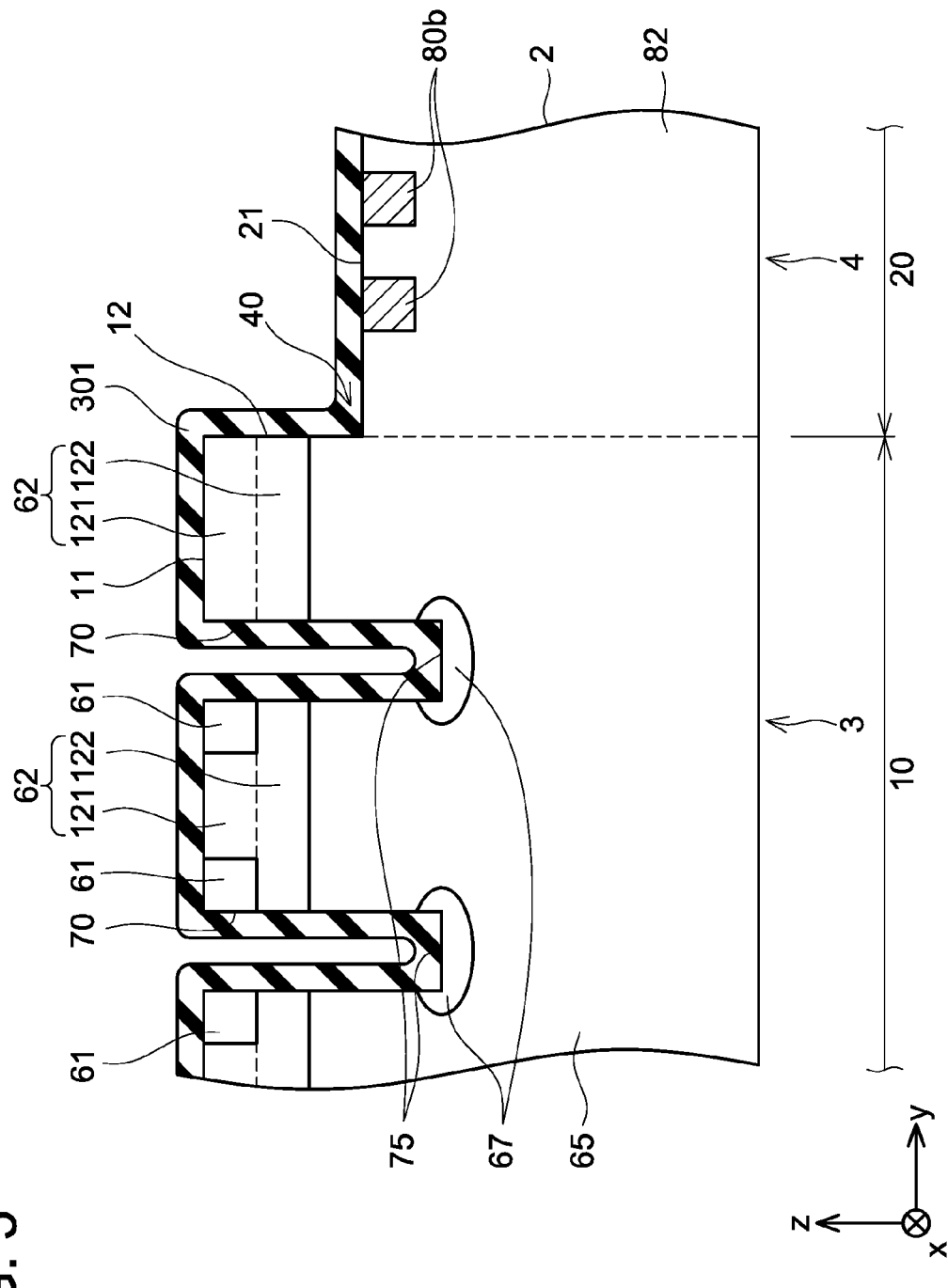
FIG. 5 is a view (2) for explaining the manufacturing method of the semiconductor device.

Next, as shown in FIG. 5, a step of depositing a material 301 of the gate insulation films on the upper surface of the semiconductor substrate 2 is performed. The gate insulation film material 301 is deposited over from the first portion 10 to the second portion 20 of the semiconductor substrate 2. Further, the gate insulation film material 301 is deposited on the inner surface of each trench 70. SiO2 can be used as the gate insulation film material 301, for example.

Figure 6:
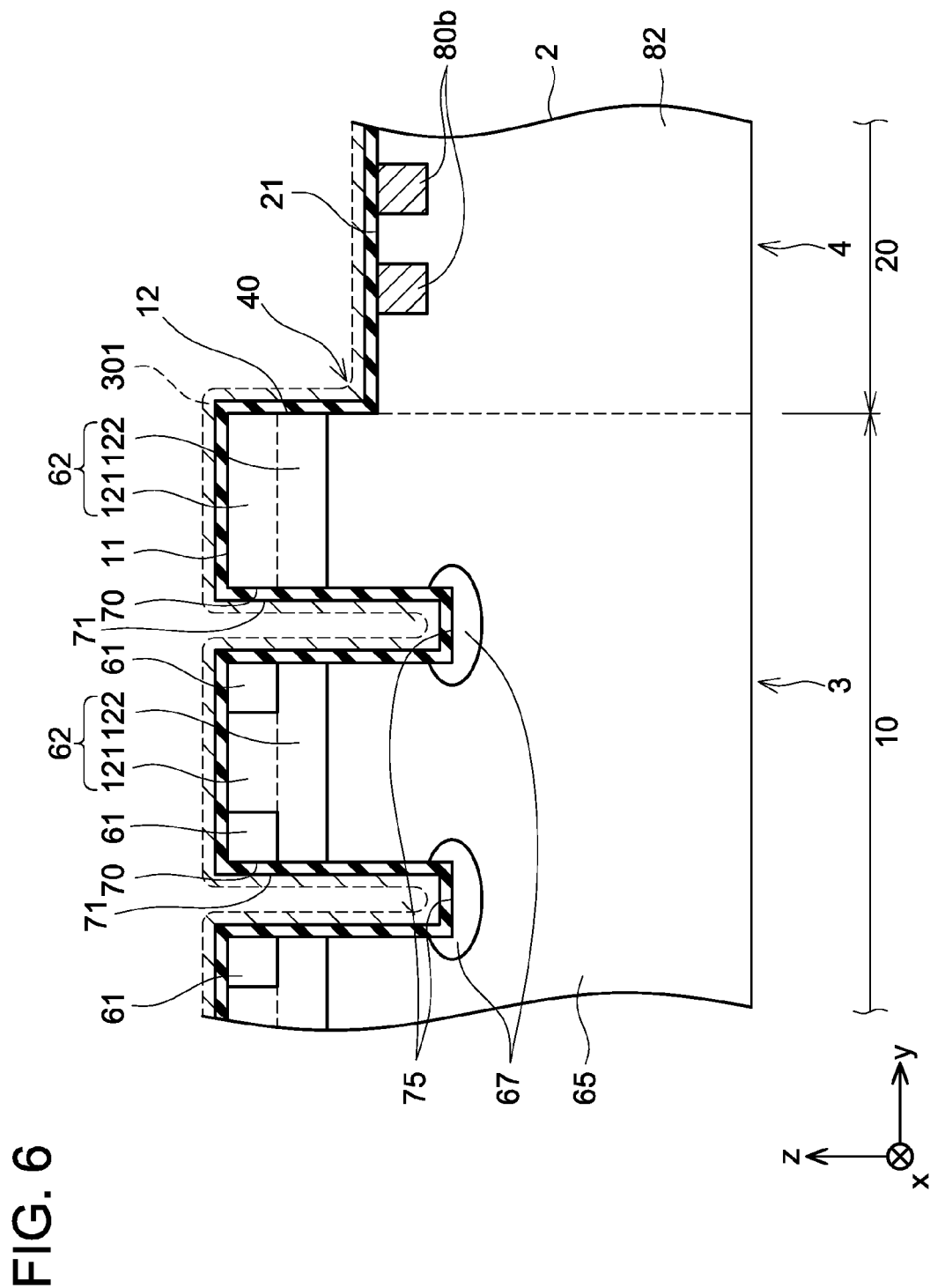
FIG. 6 is a view (3) for explaining the manufacturing method of the semiconductor device.

Next, as shown in FIG. 6, a step of etching the gate insulation film material 301 deposited on the semiconductor substrate 2 is performed. When the gate insulation film material 301 is etched, the etching is performed such that a part of the gate insulation film material 301 is left on the inner surface of each trench 70. The gate insulation films 71 are formed by the gate insulation film material 301 left on the inner surfaces of the trenches 70. Further, on the upper surface of the semiconductor substrate 2 as well, a part of the gate insulation film material 301 is left over from the first portion 10 to the second portion 20.

Figure 7:
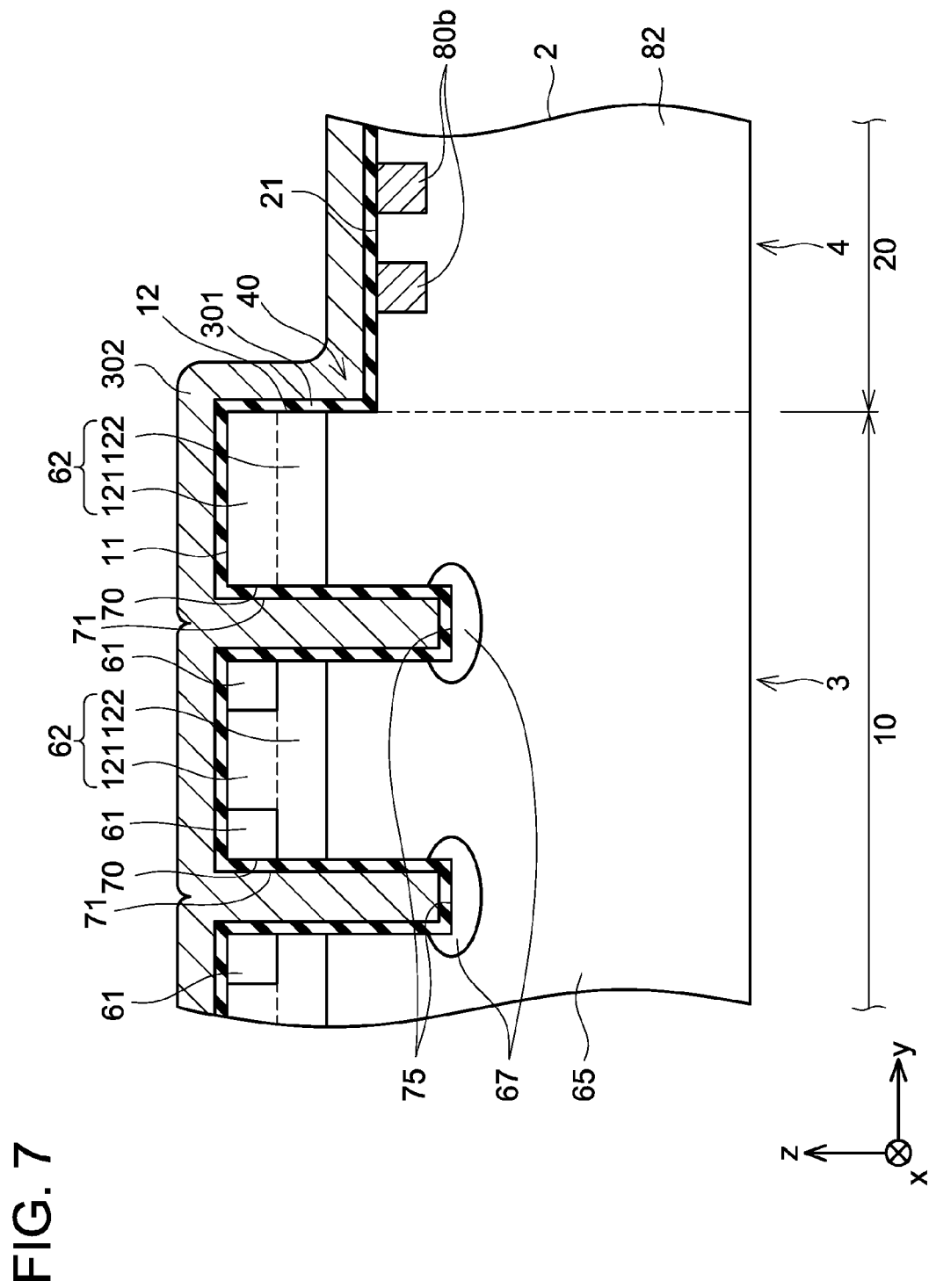
FIG. 7 is a view (4) for explaining the manufacturing method of the semiconductor device.

Next, as shown in FIG. 7, a step of depositing a material 302 of the gate electrodes on the gate insulation films 71 is performed. The gate electrode material 302 is deposited over from the first portion 10 to the second portion 20 of the semiconductor substrate 2, on the gate insulation film material 301 which is left. Further, the gate electrode material 302 is deposited in the trenches 70. The gate electrode material 302 is deposited in an inner side of each gate insulation film 71. Polysilicon can be used as the gate electrode material 302.

Figure 8:
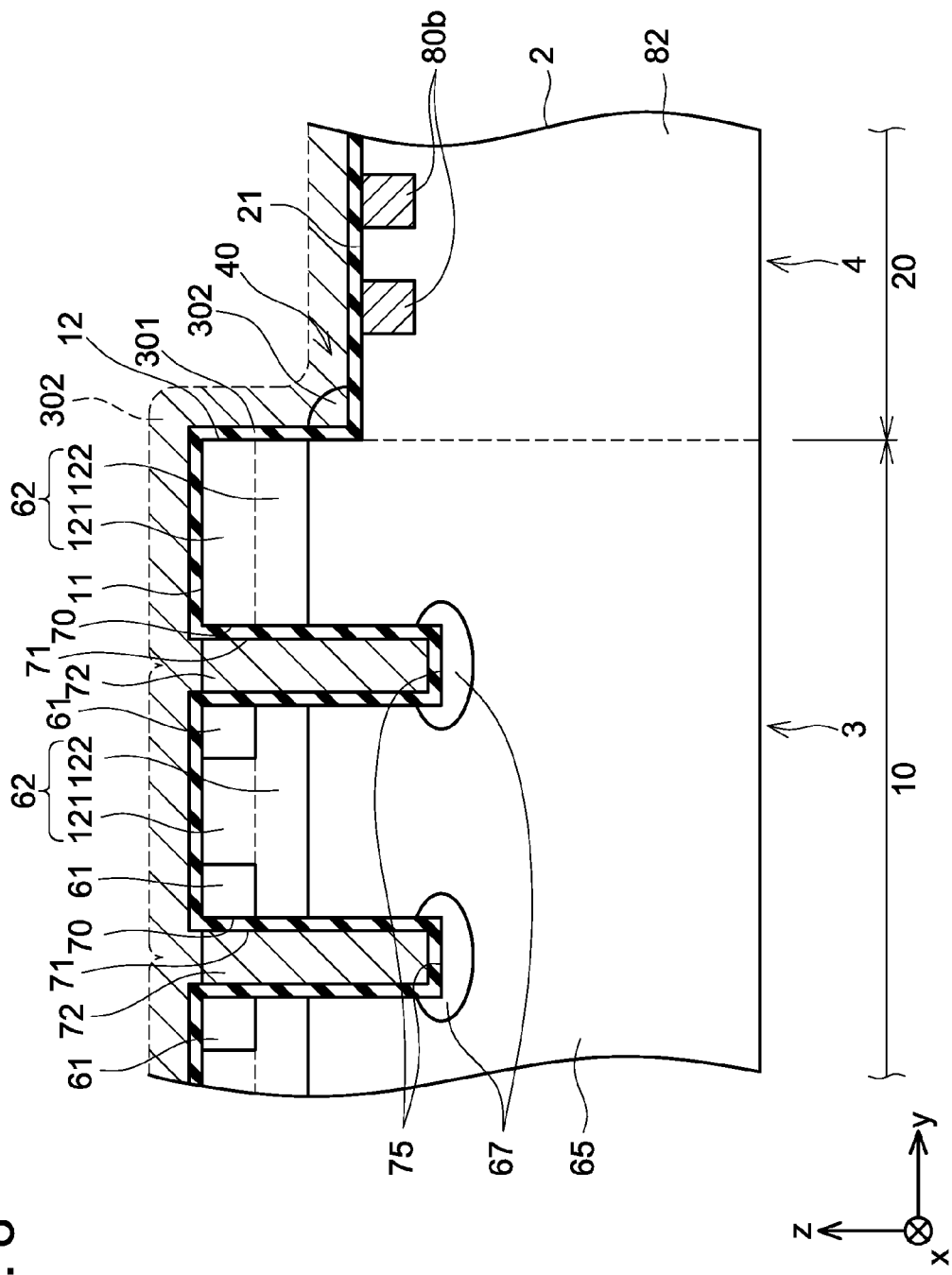
FIG. 8 is a view (5) for explaining the manufacturing method of the semiconductor device.

Next, as shown in FIG. 8, a step of etching the gate electrode material 302 is performed. When the gate electrode material 302 is etched, the etching is performed such that a part of the gate electrode material 302 is left in each trench 70. The gate electrodes 72 are formed in the trenches 70 by the gate electrode material 302 being left in the trenches 70. Further, in the portion where the first portion 10 and the second portion 20 adjoin to each other, a part of the gate electrode material 302 is left on the upper surface 21 of the second portion 20. The part of the gate electrode material 302 is left at a corner 40 between the side surface 12 of the first portion 10 and the upper surface 21 of the second portion 20.

Figure 9:
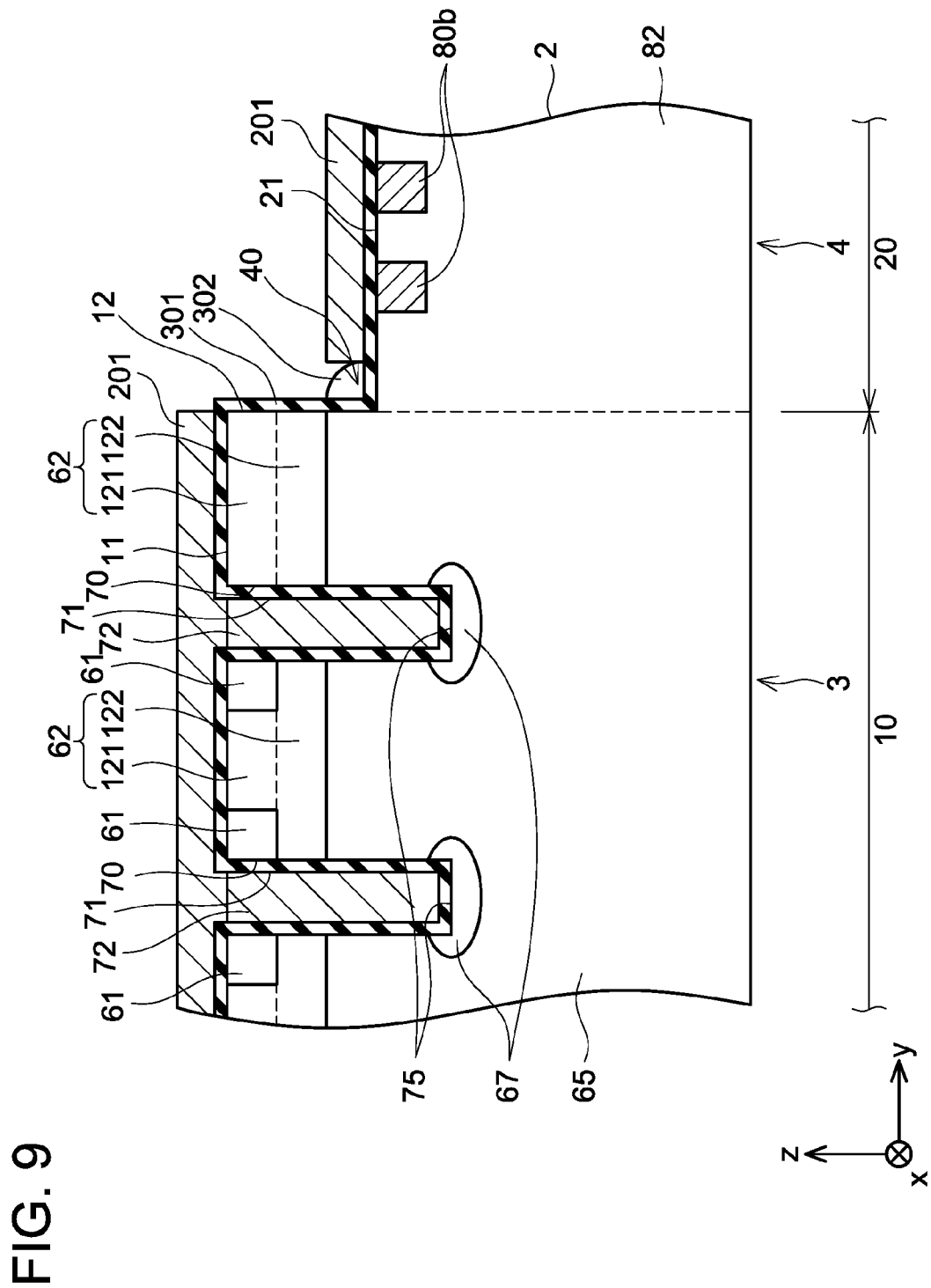
FIG. 9 is a view (6) for explaining the manufacturing method of the semiconductor device.

Next, as shown in FIG. 9, a step of forming a mask 201 on the first portion 10 and the second portion 20 of the semiconductor substrate 2 is performed. The mask 201 is formed to cover an entirety of the first portion 10. Further, the mask 201 is formed to cover a part of the second portion 20. The mask 201 covers the gate insulation films 71 and the gate electrodes 72. Further, the mask 201 is formed such that the portion where the first portion 10 and the second portion 20 adjoin to each other is exposed. That is, the mask 201 is formed such that the gate electrode material 302 which is left on the upper surface 21 of the second portion 20 is exposed. Further, the mask 201 is formed such that the side surface 12 of the first portion 10 is exposed.

Figure 10:
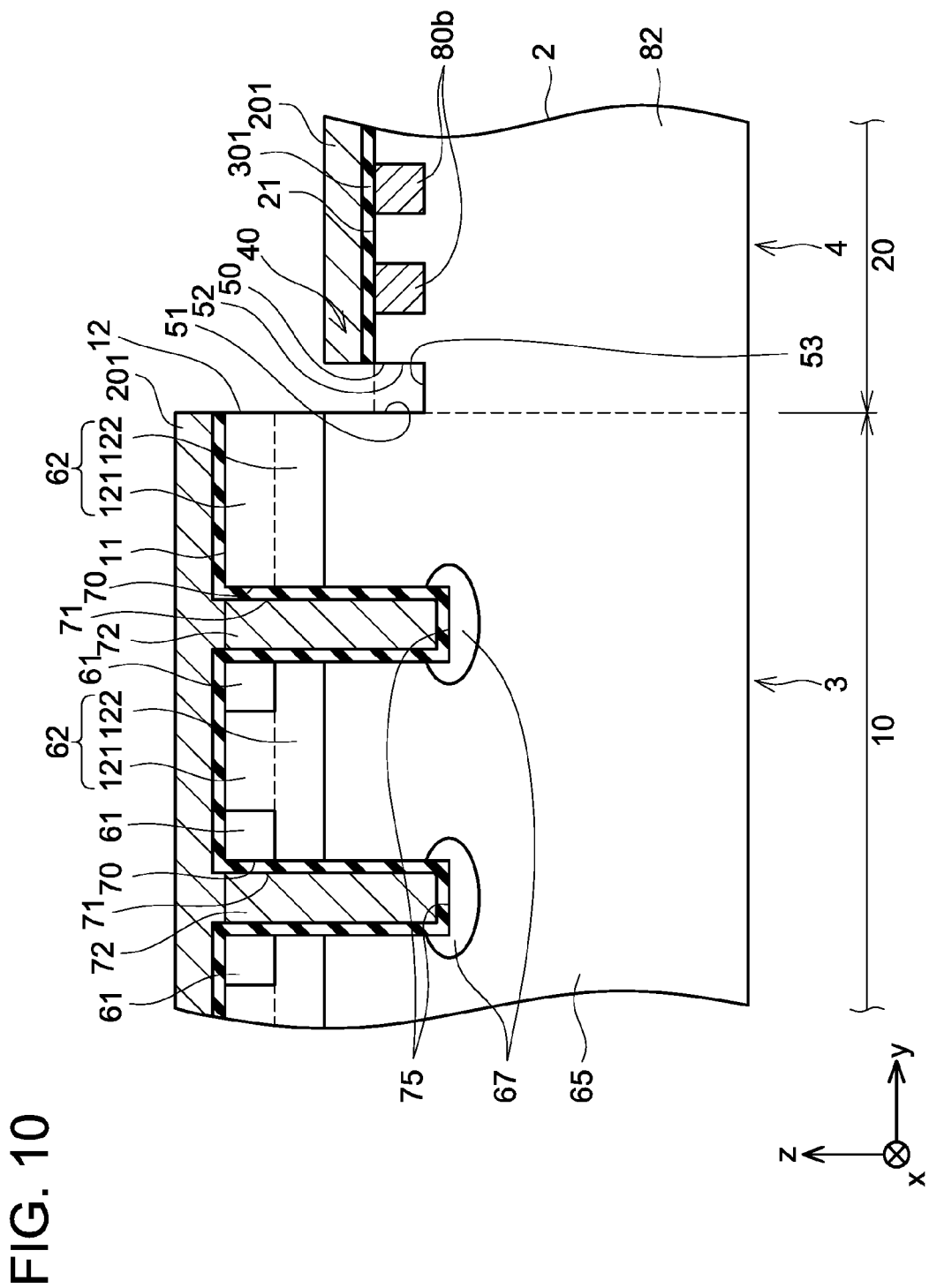
FIG. 10 is a view (7) for explaining the manufacturing method of the semiconductor device.

Next, the gate electrode material 302 at the corner 40 is removed by etching, and afterwards, the gate insulation film material 301 on the first portion 10 and at the corner 40 is removed by etching. Next, as shown in FIG. 10, a step of etching the semiconductor substrate 2 is performed in a state where the mask 201 is provided. In this step, a portion of the upper surface 21 of the second portion 20 which is exposed from the mask 201 is etched. Specifically, the upper surface 21 of the second portion 20 at the position where the first portion 10 and the second portion 20 adjoin to each other (i.e., the corner 40) is etched. By the etching, the recess 50 is formed at the position where the first portion 10 and the second portion 20 adjoin to each other. The recess 50 extends along the side surface 12 of the first portion 10.

Figure 11:
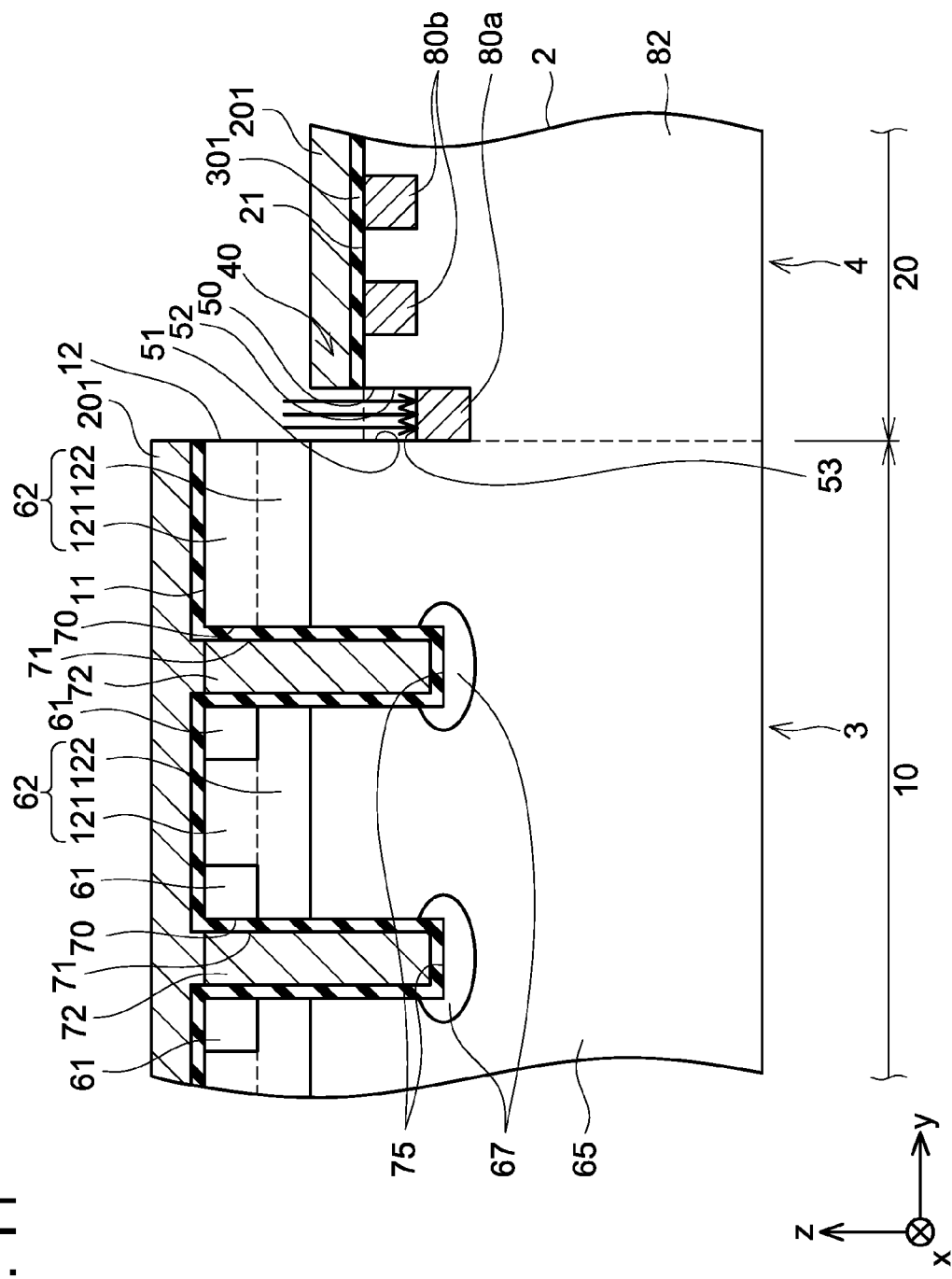
FIG. 11 is a view (8) for explaining the manufacturing method of the semiconductor device.

Next, as shown in FIG. 11, a step of forming the FLR 80a by radiating impurities to the recess 50 is performed. The impurities are implanted into the bottom surface 53 of the recess 50, and the FLR 80a is formed below the recess 50 thereby.

Figure 12:
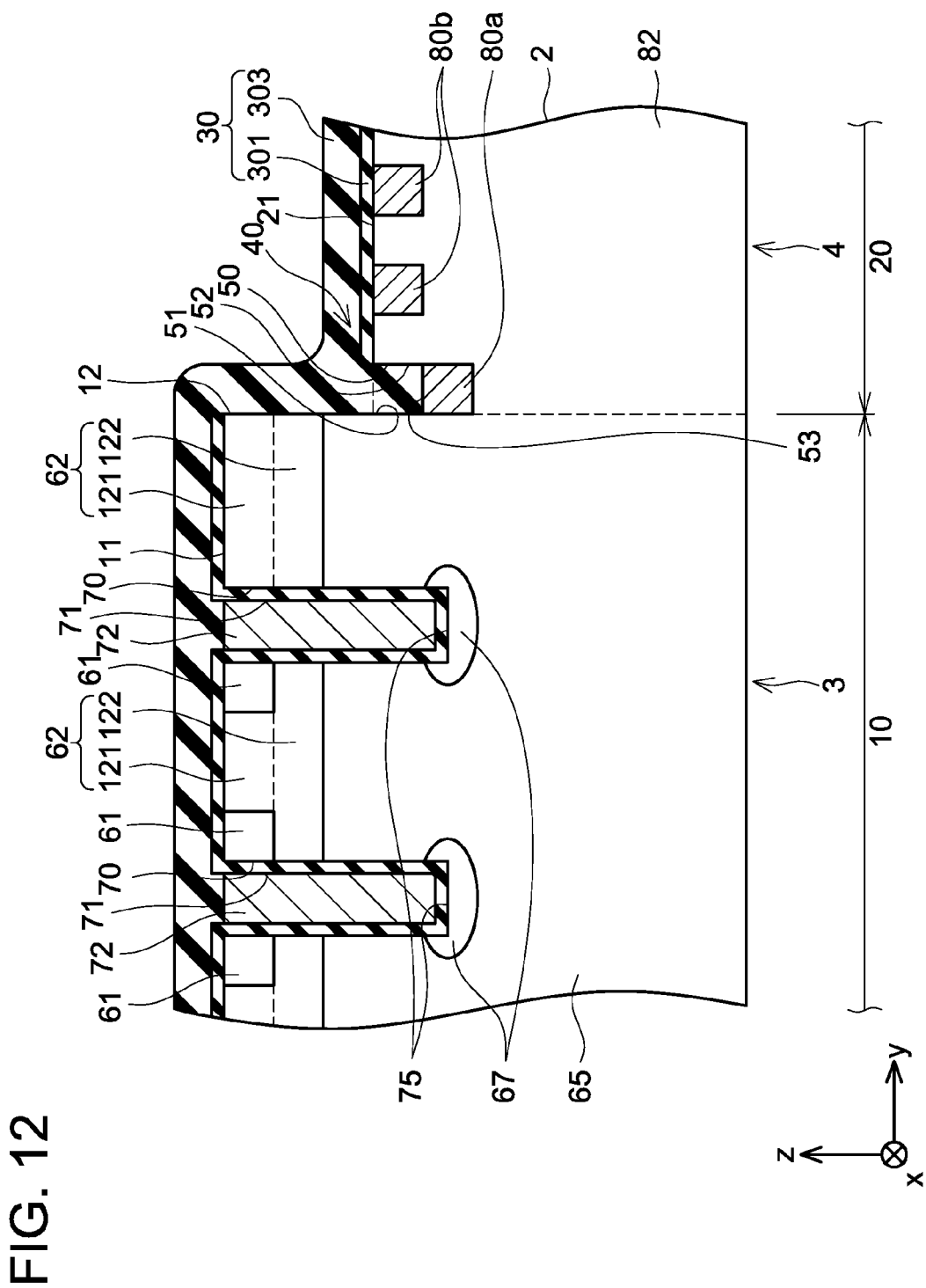
FIG. 12 is a view (9) for explaining the manufacturing method of the semiconductor device.

Next, as shown in FIG. 12, the mask 201 is removed. Further, a step of depositing a material 303 of the insulation film is performed. SiO2 can be used as the insulation film material 303, for example. The insulation film material 303 is deposited over from the first portion 10 to the second portion 20. The insulation film material 303 becomes integrated with the gate insulation film 71 which is left on the upper surface 11 of the first portion 10 and the upper surface 21 of the second portion 20. Further, at the position where the first portion 10 and the second portion 20 adjoin to each other, the recess 50 is filled with the insulation film material 303. The insulation film material 303 is deposited isotropically. Therefore, in the recess 50, the insulation film material 303 starts to be deposited from the bottom surface 53 and the side surfaces 51, 52 of the recess 50. Further, here, the insulation film material 303 is grown on the first portion 10 and the second portion 20 so as to have a thickness thicker than a half of the width of the recess 50. Due to this, the recess 50 is filled with the insulation film material 303, without any space left therein. The insulation film 30 is made of the insulation film material 303. The insulation film 30 contains the gate insulation film material 301 integrated with the insulation film material 303. The insulation film 30 extends over from the first portion 10 to the second portion 20, and fills the recess.

Figure 13:
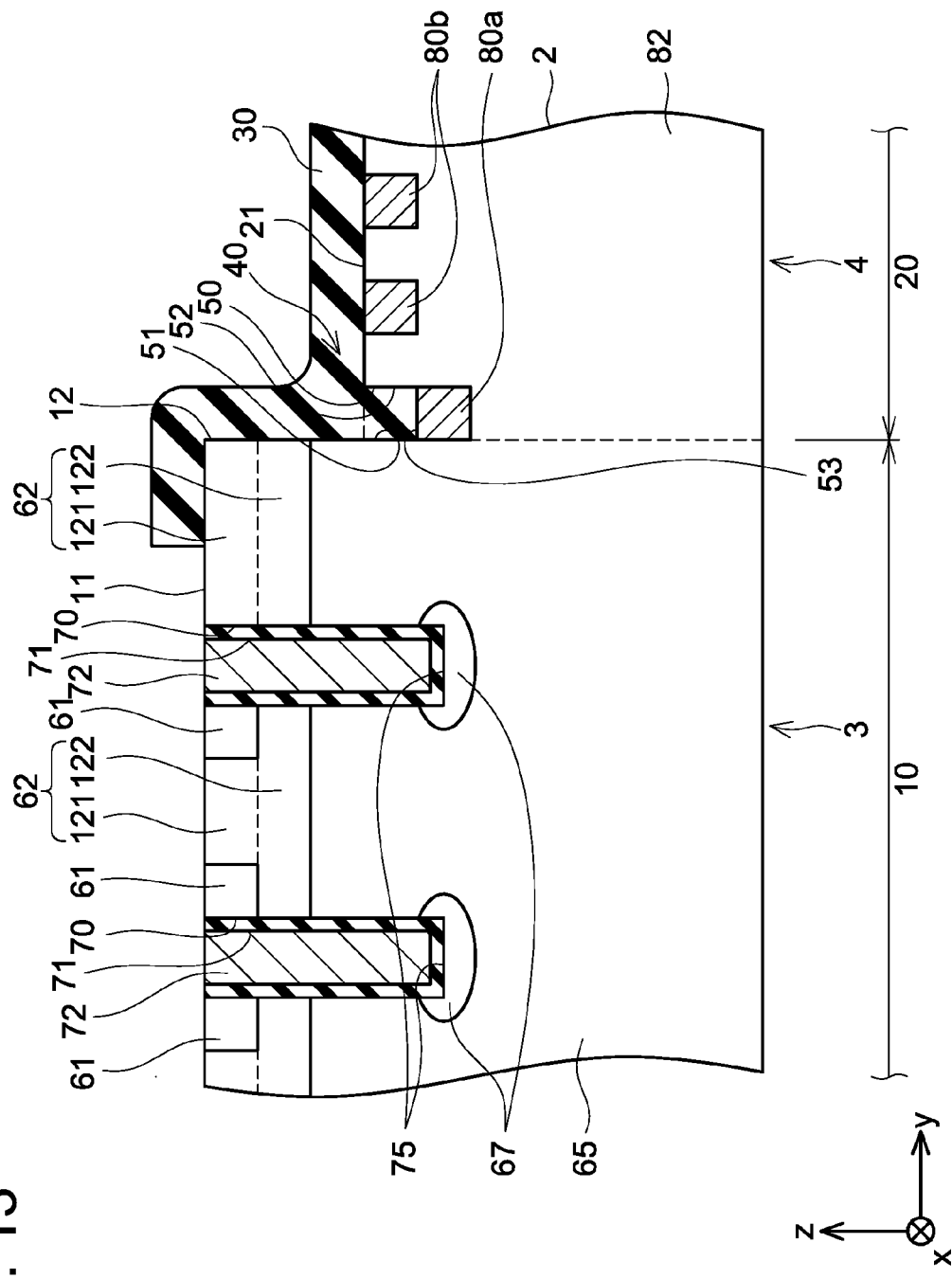
FIG. 13 is a view (10) for explaining the manufacturing method of the semiconductor device.

Next, as shown in FIG. 13, a step of etching an unnecessary portion of the insulation film 30 is performed. By this etching, the insulation film 30 formed on the gate electrodes 72 is removed, and upper surfaces of the gate electrodes 72 are exposed thereby. Further, the insulation film 30 formed on a part of the first portion 10 is removed, and the part of the upper surface 11 of the first portion 10 is exposed.

Figure 14:
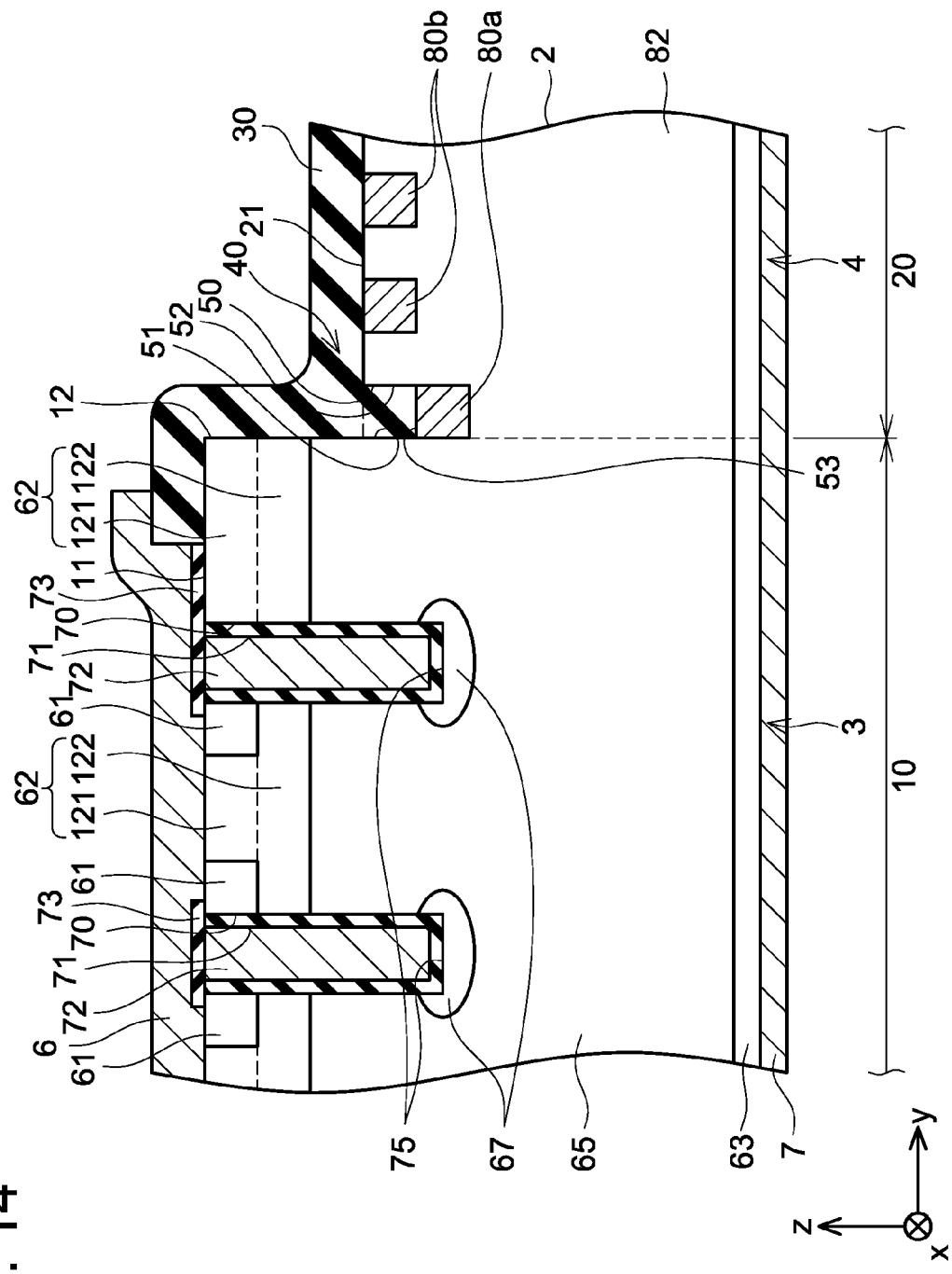
FIG. 14 is a view (11) for explaining the manufacturing method of the semiconductor device.

Next, as shown in FIG. 14, the interlayer insulation film 73 is formed on each of the exposed gate electrodes 72. Further, the front surface electrode 6 is formed on the exposed upper surface 11 of the portion 10. Subsequently, the drain region 63 is formed on a rear surface side of the semiconductor substrate 2. Further, the rear surface electrode 7 is formed on the rear surface of the semiconductor substrate 2. As above, the semiconductor device shown in FIG. 1 is manufactured.

According to the above-mentioned manufacturing method, since the insulation film 30 fills the recess 50 when formed, the insulation film 30 is densely deposited at the position where the first portion 10 and the second portion 20 adjoin to each other. Due to this, even when the temperature of the insulation film 30 becomes high, the void can be suppressed from occurring in the insulation film 30. Further, when the insulation film 30 expands, displacement of the insulation film 30 which fills the recess 50 is restrained by the side surfaces 51 and 52 of the recess 50. Due to this, the displacement of the insulation film 30 is suppressed, and the crack can be suppressed from occurring in the insulation film 30.

Correspondence Relationships

In the above embodiment, the floating regions 67 is an example of "first region" in the claims, and the drift region 65 is an example of "second region" in the claims.

One embodiment has been described, however, specific aspects are not limited to the above-mentioned embodiment. Hereinbelow, configurations same as the configurations described above will be given the same reference signs, and explanations thereof will be omitted.

Second Embodiment

Figure 15:
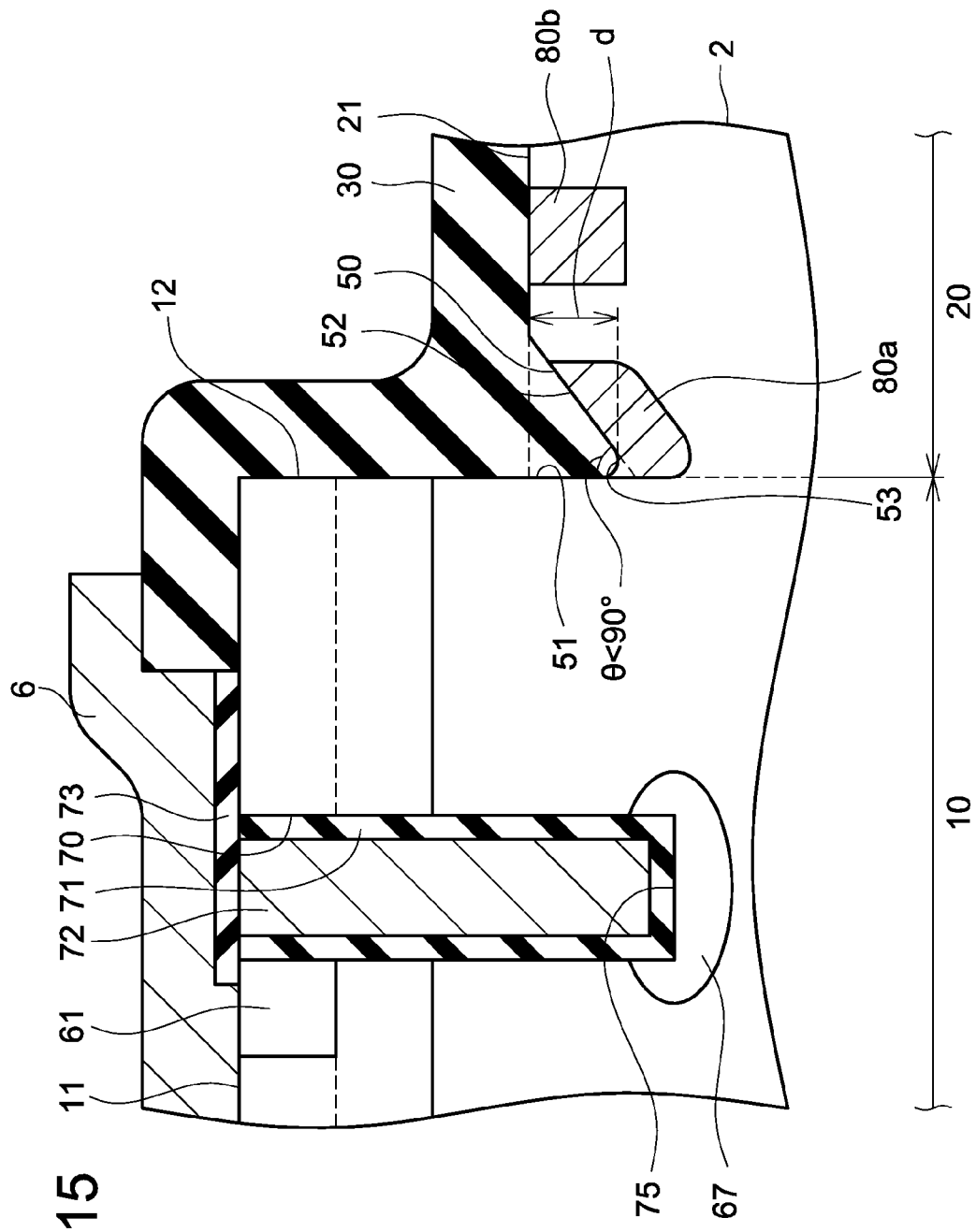
FIG. 15 is an enlarged view of a main section of a semiconductor device according to another embodiment.

In a second embodiment, as shown FIG. 15, an angle θ between the second side surface 52 of the recess 50 and the side surface 12 of the first portion 10 is equal to or less than 90 degrees. The second side surface 52 of the recess 50 slopes obliquely downward toward the first portion 10. A depth d of the recess 50 becomes continuously deeper toward the first portion 10. A capacity of the recess 50 of the second embodiment is smaller than a capacity of the recess 50 of the first embodiment. The bottom surface 53 of the recess 50 is curved.

According to the semiconductor device 1 of the second embodiment, since the capacity of the recess 50 is small, the insulation film 30 can densely fill the recess 50. Due to this, the void and crack can be further suppressed from occurring in the insulation film 30 which fills the recess 50. Further, the depth d of the recess 50 continuously changes, but does not change abruptly. Due to this, the electric field concentration in the vicinity of the recess 50 can be alleviated. As a result, the deterioration of the insulation film 30 covering the recess 50 can be suppressed.

Third Embodiment

Figure 16:
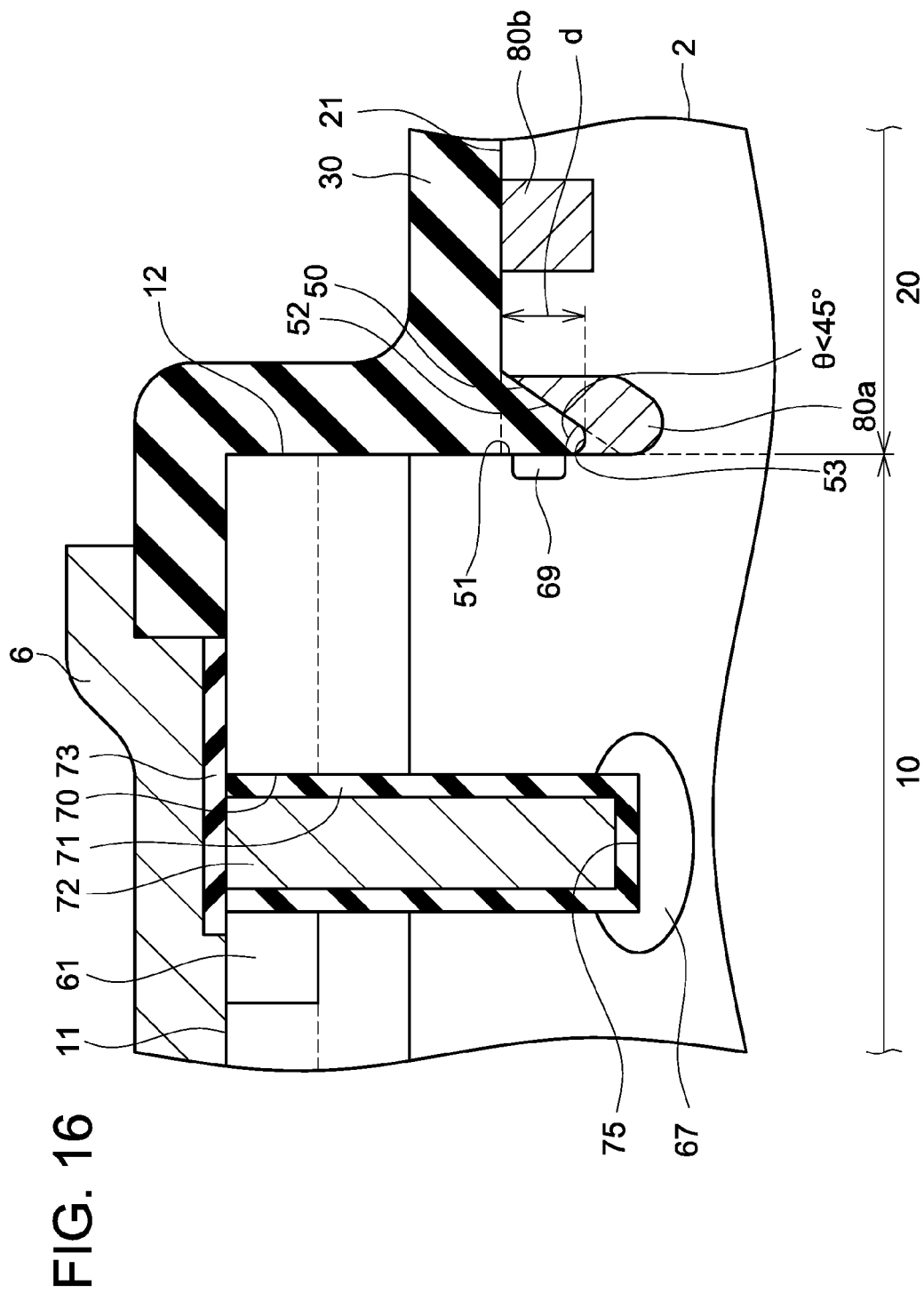
FIG. 16 is a view for explaining a manufacturing method of a semiconductor device according to yet another embodiment.

In a third embodiment, as shown in FIG. 16, the angle θ between the second side surface 52 of the recess 50 and the side surface 12 of the first portion 10 is equal to or less than 45 degrees. Further, in the third embodiment, a deep region 69 is provided in the first portion 10 of the semiconductor substrate 2. The deep region 69 is of the p-type. The deep region 69 is provided in a range exposed on the first side surface 51 of the recess 50. The deep region 69 is separated from the base region 62 and the floating region 67 by the drift region 65.

Figure 17:
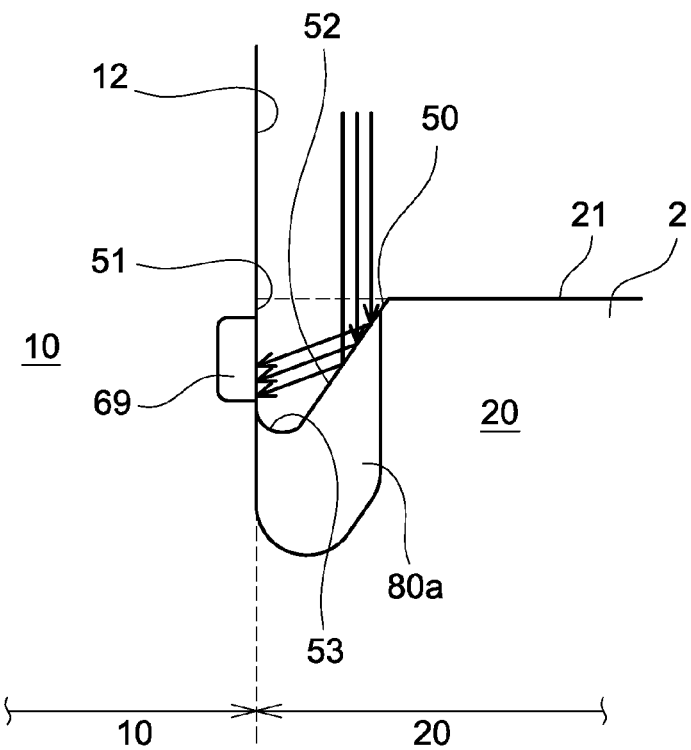
FIG. 17 is a view for explaining a manufacturing method of a semiconductor device according to yet another embodiment.

When the deep region 69 is formed, impurities are radiated to the recess 50 as shown in FIG. 17. A part of the radiated impurities is reflected on the second side surface 52 of the recess 50, and implanted into the first portion 10 of the semiconductor substrate 2. Due to this, the deep region 69 is formed in the first portion 10. Further, another part of the impurities radiated to the recess 50 is implanted into the bottom surface 53 and the second side surface 52 of the recess 50. Due to this, the FLR 80a is formed. The FLR 80a is formed in a region exposed on the second side surface 52 and the bottom surface 53 of the recess 50.

According to the semiconductor device 1 of the third embodiment, a depletion layer expands from a boundary between the deep region 69 and the drift region 65 to its surrounding. Therefore, the electric field concentration around the recess 50 and the bottom surface 75 of the trench 70 can be alleviated. Due to this, the deterioration of the insulation film 30 and the gate insulation film 71 can be suppressed. Further, since a donor concentration in the drift region 65 becomes low, a depletion layer easily expands from a boundary between the base region 62 and the drift region 65 to its surrounding. Due to this, the electric field concentration around the recess 50 and the bottom surface 75 of the trench 70 can be alleviated.

Fourth Embodiment

Figure 18:
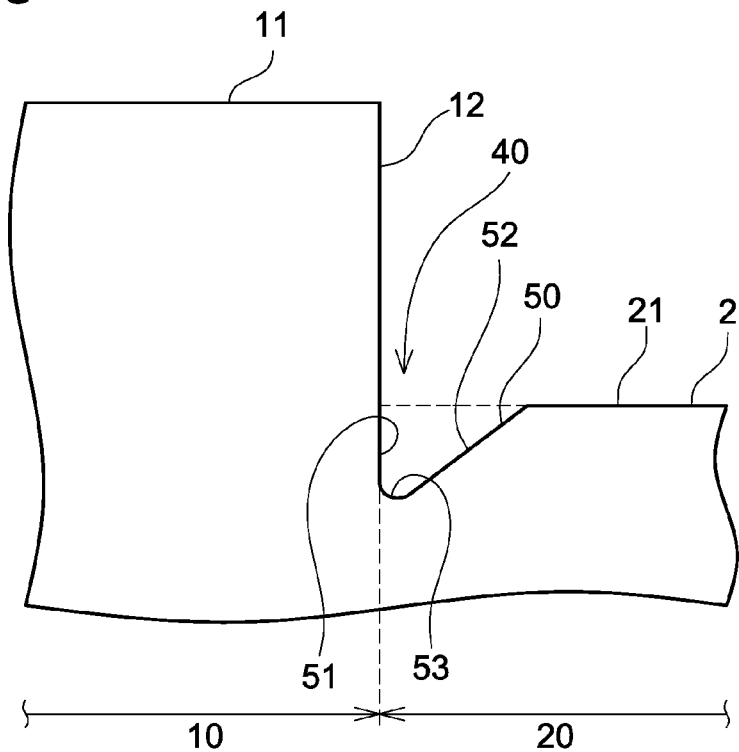
FIG. 18 is an enlarged view of a main section of the semiconductor device according to yet the other embodiment.

A method of forming the recess 50 in the second portion 20 of the semiconductor substrate 2 is not limited to the above embodiments. In a fourth embodiment, as shown in FIG. 18, a phenomenon where the recess 50 is formed in the upper surface 21 of the second portion 20 at the position adjoining the first portion 10 when the thick first portion 10 and the thin second portion 20 are formed by etching a part of the semiconductor substrate 2 is utilized. Upon etching the semiconductor substrate 2, the semiconductor substrate 2 is etched more in the portion where the first portion 10 and the second portion 20 adjoin to each other than in its surrounding part. That is, the corner 40 between the side surface 12 of the first portion 10 and the upper surface 21 of the second portion 20 is etched deeper than its surrounding. Due to this, the recess 50 extending in the thickness direction (the z direction) of the semiconductor substrate 2 is formed. The second side surface 52 of the recess 50 formed as such is sloped. In the fourth embodiment, when the recess 50 is formed, the angle θ between the second side surface 52 of the recess 50 and the side surface 12 of the first portion 10 is made equal to or less than 90 degrees, or equal to or less than 45 degrees. By adjusting a condition of the etching, the angle θ between the side surface of the recess 50 and the side surface of the first portion 10 can be adjusted.

Further, in the above embodiments, the high breakdown voltage structure provided in the peripheral region 4 is an FLR structure provided with the plurality of FLRs 80, however, the high breakdown voltage structure is not limited thereto. In another embodiment, the high breakdown voltage structure may be a RESURF structure.

Further, in the above embodiments, the MOSFET is described as an example of the semiconductor element, however, the configuration is not limited thereto. In another embodiment, the semiconductor element may be an IGBT (Insulated Gate Bipolar Transistor).

Specific examples of the present invention have been described in detail, however, these are mere exemplary indications and thus do not limit the scope of the claims. The art described in the claims includes modifications and variations of the specific examples presented above. Technical features described in the specification and the drawings may technically be useful alone or in various combinations, and are not limited to the combinations as originally claimed. Further, the art described in the description and the drawings may concurrently achieve a plurality of aims, and technical significance thereof resides in achieving any one of such aims.

Technical elements disclosed in the present specification will be described hereinbelow as examples. It should be noted that the respective technical elements are independent of one another, and are useful solely or in combinations.

In a semiconductor device, a second portion may be provided with a plurality of field limiting rings of a first conductivity type. The field limiting ring which is the nearest to a first portion is preferably provided below a recess.

A width of the recess in a direction along which the first portion and the second portion adjoin to each other is preferably equals to or less than twice a thickness of an insulation film provided on an upper surface of the second portion.

A trench may be provided in an upper surface of the first portion. A semiconductor substrate preferably comprises a first region of the first conductivity type provided around a bottom surface of the trench, and a second region of a second conductivity type provided between the field limiting ring which is the nearest to the first portion and the first region. It is preferable that the bottom surface of the trench is located lower than a bottom surface of the recess, and a distance from the bottom surface of the trench to the bottom surface of the recess in a thickness direction of the semiconductor substrate is shorter than a distance from the bottom surface of the recess to the upper surface of the second portion.

An angle between a side surface of the recess and a side surface of the first portion may be equal to or less than 90 degree.

The angle between the side surface of the recess and the side surface of the first portion may be equal to or less than 45 degrees.

A depth of the recess may continuously become deeper toward the first portion.

A method of manufacturing the semiconductor device may further comprise a step of forming the field limiting ring below the recess by radiating impurities to the recess.

REFERENCE SIGNS LIST

1: Semiconductor device
2: Semiconductor substrate
3: Element region
4: Peripheral region
6: Front surface electrode
7: Rear surface electrode
10: First portion
11: Upper surface
12: Side surface
20: Second portion
21: Upper surface
30: Insulation film
40: Corner
50: Recess
51: First side surface
52: Second side surface
53: Bottom surface
61: Source region
62: Base region
63: Drain region
65: Drift region
67: Floating region
69: Deep region
70: Trench
71: Gate insulation film
72: Gate electrode
73: Interlayer insulation film
75: Bottom surface
80: Field limiting ring
82: Peripheral drift region
121: Base contact region
122: Low-concentration base region
201: Mask
301: Gate insulation film material
302: Gate electrode material
303: Insulation film material

The invention claimed is:

1. A semiconductor device comprising:
a semiconductor substrate in which a semiconductor element is provided; and
an insulation film provided on the semiconductor substrate,
wherein
the semiconductor substrate comprises a first portion and a second portion which has a thickness thinner than a thickness of the first portion, wherein an upper surface of the second portion is positioned lower than an upper surface of the first portion,
a recess extending in a thickness direction of the semiconductor substrate is provided on the upper surface of the second portion located at a position where the first portion and the second portion adjoin each other,
the insulation film extends over from the first portion to the second portion, and fills the recess,
a plurality of field limiting rings is provided in the second portion,
the field limiting ring which is nearest to the first portion is provided below the recess,
the field limiting rings are of a first conductivity type,
a trench is provided in the upper surface of the first portion,
a first region of the first conductivity type is provided in a vicinity of a bottom surface of the trench,
a second region of a second conductivity type exists between the field limiting ring which is the nearest to the first portion and the first region,
the bottom surface of the trench is located lower than a bottom surface of the recess, and
a distance from the bottom surface of the trench to the bottom surface of the recess in the thickness direction of the semiconductor substrate is shorter than a distance from the bottom surface of the recess to the upper surface of the second portion.

2. The semiconductor device according to claim 1, wherein
a width of the recess in a direction along which the first portion and the second portion adjoin each other is equal to or less than twice a thickness of the insulation film provided on the upper surface of the second portion.

3. The semiconductor device according to claim 1, wherein
an angle between a side surface of the recess on a second portion side and a side surface of the first portion is equal to or less than 90 degrees.

4. The semiconductor device according to claim 1, wherein
an angle between a side surface of the recess on a second portion side and a side surface of the first portion is equal to or less than 45 degrees.

5. The semiconductor device according to claim 1, wherein
a depth of the recess continuously increases toward the first portion.

6. A method of manufacturing a semiconductor device utilizing a semiconductor substrate that comprises a first portion and a second portion which has a thickness thinner than a thickness of the first portion, wherein an upper surface of the second portion is located lower than an upper surface of the first portion, the method comprising:
forming a recess extending in a thickness direction of the semiconductor substrate on the upper surface of the second portion located at a position where the first portion and the second portion adjoin each other,
forming a plurality of field limiting rings, wherein a field limiting ring which is nearest to the first portion is formed below the recess by implanting impurities to the recess, and
forming, on the semiconductor substrate, an insulation film extending over from the first portion to the second portion and filling the recess, wherein
the field limiting rings are of a first conductivity type,
a trench is provided in the upper surface of the first portion,
a first region of the first conductivity type is provided in a vicinity of a bottom surface of the trench,
a second region of a second conductivity type exists between the field limiting ring which is the nearest to the first portion and the first region,
the bottom surface of the trench is located lower than a bottom surface of the recess, and
a distance from the bottom surface of the trench to the bottom surface of the recess in the thickness direction of the semiconductor substrate is shorter than a distance from the bottom surface of the recess to the upper surface of the second portion.

\* \* \* \* \*